(12) United States Patent
He et al.

(10) Patent No.: US 6,834,012 B1
(45) Date of Patent: Dec. 21, 2004

(54) MEMORY DEVICE AND METHODS OF USING NEGATIVE GATE STRESS TO CORRECT OVER-ERASED MEMORY CELLS

(75) Inventors: Yi He, Fremont, CA (US); Edward Franklin Runnion, Santa Clara, CA (US); Zhizheng Liu, Sunnyvale, CA (US); Zengtao Liu, Sunnyvale, CA (US); Mark William Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/863,673

(22) Filed: Jun. 8, 2004

(51) Int. Cl.[7] .......................... G11C 16/04; G11C 16/06
(52) U.S. Cl. ............................ 365/185.18; 365/185.22; 365/185.29; 365/185.3
(58) Field of Search ....................... 365/185.18, 185.22, 365/185.29, 185.3

(56) References Cited

U.S. PATENT DOCUMENTS

| 5,359,558 | A | 10/1994 | Chang et al. |
| 6,331,951 | B1 * | 12/2001 | Bautista et al. ......... 365/185.29 |
| 6,438,041 | B1 | 8/2002 | Yamada et al. |
| 6,493,266 | B1 * | 12/2002 | Yachareni et al. ...... 365/185.22 |
| 6,717,849 | B2 | 4/2004 | Joo |

* cited by examiner

*Primary Examiner*—Trong Phan
(74) *Attorney, Agent, or Firm*—Eschweiler & Associates, LLC

(57) ABSTRACT

Methods of operating dual bit flash memory devices and correcting over-erased dual bit flash memory devices are provided. The present invention includes a corrective action that employs a negative gate to correct over-erased memory cells without substantially altering threshold voltage values or charge states for properly erased memory cells. The negative gate stress is performed as a block operation by applying a negative gate voltage to gates and connecting active regions and a substrate to ground.

23 Claims, 7 Drawing Sheets

MEMORY DEVICE AND METHODS OF USING NEGATIVE GATE STRESS TO CORRECT OVER-ERASED MEMORY CELLS

FIELD OF INVENTION

The present invention relates generally to memory devices and the like, and in particular to a method of correcting over-erased dual bit memory devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where single bits of data are stored in and read from respective memory cells. The cells in such structures are programmed and erased by adjusting threshold voltages of these cells by, for example, programming by hot electron injection and erasing by Fowler-Nordheim tunneling. As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer.

Individual memory cells are organized into individually addressable units or groups, which are accessed for read, program, or erase operations through address decoding circuitry. The individual memory cells are typically comprised of a semiconductor structure adapted for storing a bit of data For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The single bit memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

Another memory technology is dual bit memory, which allows multiple bits to be stored in a single cell. In this technology, a memory cell is essentially split into two substantially identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, some forms of dual bit memory cells have a semiconductor substrate with implanted or epitaxy-grown conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines.

Programming circuitry controls two bits per cell by applying a signal to the wordline, which acts as a control gate, and changing bitline connections such that a first bit is stored by the source and drain being connected in one arrangement and a second bit is stored by the source and drain being interchanged in another arrangement. Erasing is performed as a blanket operation wherein an array or sector of cells can be simultaneously erased. Generally, a gate voltage is applied to the control gates via the wordline(s) and a drain-voltage is applied to the drains via the bitlines. The sources are configured to float or ground.

A suitable mechanism for programming dual bit memory cells is hot electron injection, which involves applying appropriate voltage potentials to each of the gate electrode, the source, and the drain of the memory device for a specified duration until a charge storing layer accumulates charge. A suitable mechanism for erasing dual bit memory cells is hot hole injection, which involves applying appropriate voltage potentials to the gate electrode and the drain, while floating or grounding the source, to erase a bit of one of the memory cells. These potentials are applied for a specific duration (i.e., pulsed). Conversely, the other bit of the cell is erased by floating the drain and applying appropriate voltage potentials to the source and the gate. Alternatively, both the normal and complementary bits can be erased simultaneously As stated above, erasing of flash memory is a blanket operation in which cells within an array are typically erased simultaneously. Erasing of the memory cells can be accomplished by repeated applications of short erase pulses, as described above. After each erase pulse, an erase verification can be performed to determine if each cell in the array is "under-erased," (i.e., whether the cell has a threshold voltage above a predetermined limit). If an under-erased cell is detected, an additional erase pulse can be applied to the entire array. With such an erase procedure, cells that are not under-erased will also be repeatedly erased, leading to some cells becoming "over-erased" before other cells are sufficiently erased. A memory cell having a threshold voltage erased below a predetermined limit is commonly referred to as being over-erased. In this case, the charge storing layer of the over-erased cells is depleted of electrons and becomes positively charged.

An over-erased condition is undesirable for many reasons. For instance, the programming characteristics of an over-erased cell deteriorate more rapidly, affecting, among other things, the number of times that a cell can be reprogrammed. Over-erased cells are also undesirable because they can cause bitline leakage current during program and/or read procedures.

In view of the foregoing, a need exists for a device and method of erasing an array of multi-bit memory cells, which mitigates over-erase and problems associated therewith.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention mitigates over-erase conditions in flash memory devices and also mitigates undesireable effects caused by over-erased flash memory cells by correcting over-erased flash memory cells after an erase procedure. The present invention includes a corrective action that employs a negative gate stress to correct over-erased memory cells without substantially altering threshold voltage values or charge states for properly erased memory cells. Application of the negative gate stress causes threshold voltages for over-erased cells (i.e., cells that have a threshold voltage below a certain value) to increase, but does not substantially alter threshold voltages for normal or properly erased memory cells.

A method of the present invention operates on an array of dual bit flash memory cells. A block erase operation is performed that erases memory cells of the array. The erase operation is verified and repeated if necessary. Application of negative gate stress is performed as a block operation by applying a negative gate voltage to gates of the memory cells and connecting active regions and a substrate of the memory cells to ground. The negative gate stress is applied with a negative gate voltage and a duration that should correct over-erased cells of the array, if present, without substantially altering non-over-erased or properly erased cells of the array.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
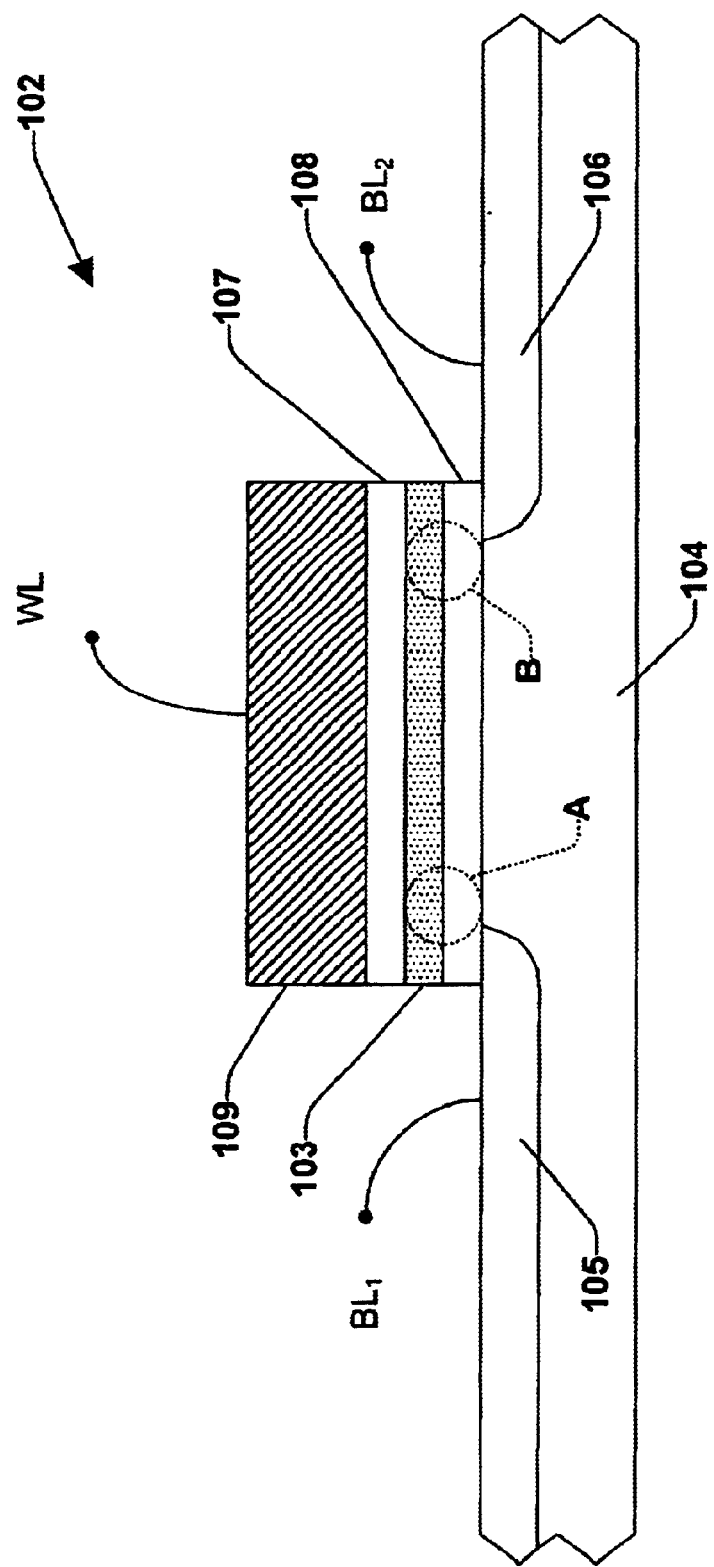
FIG. 1 is a cross sectional view illustrating a dual bit memory cell in accordance with an aspect of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Erasing of flash memory is a blanket operation in which cells within an array are erased concurrently. Erasing of the memory cells is accomplished by repeated applications of short erase pulses. After each erase pulse, an erase verification can be performed to determine if each cell in the array is "under-erased," (i.e., whether the cell has a threshold voltage above a predetermined limit). If an under-erased cell is detected, an additional erase pulse is applied to the entire array. With such an erase procedure, cells that are not under-erased will also be repeatedly erased, leading to some cells becoming "over-erased" before other cells are sufficiently erased. A memory cell having a threshold voltage erased below a predetermined limit is deemed as being over-erased. In this case, the charge storing layer of the over-erased cells is depleted of electrons and becomes positively charged.

An over-erased condition is undesirable for many reasons. For instance, the programming characteristics of an over-erased cell deteriorate more rapidly, affecting, among other things, the number of times that a cell can be reprogrammed. Over-erased flash memory cells have slowed programming performance due to column leakage, which becomes worse over time. Over-erased cells are also undesirable because they can cause bitline leakage current during program and/or read procedures. Bitline to bitline leakage from one or more over-erased cells can also reduce programming speed of non-over-erased flash memory cells. Such leakage causes actual applied source and drain voltages to vary from desired or expected applied values and can result in erroneous verify failures.

The present invention mitigates over-erase conditions in flash memory devices and also mitigates un-desirable effects caused by over-erased flash memory cells by correcting over-erased flash memory cells after an erase procedure. Over-erased flash memory cells can be corrected by applying a negative gate voltage to an entire array of flash memory cells. The threshold voltages for over-erased cells (i.e., cells that have a threshold voltage below a certain value) are increased. Generally, the threshold voltages of the over-erased cells are increased enough so that the cells are no longer over-erased (i.e., have a threshold voltage value above the certain value). Threshold voltages of non-over-erased flash memory cells are not substantially altered by the applied negative gate voltage.

Referring now to the drawings, FIG. 1 is a cross sectional view illustrating a dual bit memory cell 102 in accordance with an aspect of the present invention. The memory cell 102 comprises a charge trapping layer 103 and may comprise silicon nitride or any other type of charge trapping layer and is sandwiched between two insulating layers 107 and 108, such as silicon dioxide. A P-type substrate 104 has buried active regions including a first active region 105 and a second active region 106. The active regions 105 and 106 are n-type in this example.

Overlying the oxide layer 107 is a polysilicon gate 109. This gate 109 is doped, for example, with an N-type impurity (e.g., phosphorus). The memory cell 102 is capable of storing two data bits, a left bit represented by the dashed circle A and a right bit represented by the dashed circle B. The dual bit memory cell 102 is generally symmetrical, thus the active regions 105 and 106 are interchangeable as acting source and drain. Thus, the first active region 105 may serve as the source and the second active region 106 as the drain with respect to the right bit B. Likewise, the second active region 106 may serve as the source and the first active region 105 as the drain for the left bit A. Additionally, the first active region 105, the second active region 106, and the gate 109, are connected to or considered part of a first bitline $BL_1$, a second bitline $BL_2$, and a wordline WL, respectively, for operation in a memory array or device.

Conventionally, the cell 102 is programmed by increasing a threshold voltage for a bit of the cell to a value within a range of acceptable values and is erased by reducing the threshold voltage for a bit of the cell to a value within another range of acceptable values. The memory cell 102 can be conventionally programmed by applying a program voltage across the gate 109 and an acting drain region and connecting an acting source region to ground. The acting drain region is typically biased to a potential above the acting source. As a result of the gate bias, a high electric field is applied across the charge trapping layer 103. Due to a phenomena called "hot electron injection", electrons pass from the acting source region through a portion of the ONO layer and become trapped in the charge trapping layer 103. As a result of the trapped electrons, the threshold voltage of the memory cell is increased. In one conventional programming example, the gate is biased to 9 volts, the acting drain is biased to 5 volts, and the acting source is connected to ground. A second bit can be programmed to the cell by reversing the acting source and-drain and again applying the control gate bias.

The memory device 102 is operatively arranged to be programmed, verified, read, and erased by the application of appropriate voltage potentials to each of the gate 109, the first active region 105, and the second active region 106. The gate 109 can be coupled to or formed from a wordline (WL), the first active region 105 can be coupled to or formed from a first bitline ($BL_1$) and the second active region 106 can be coupled to or formed from a second bitline ($BL_2$) for applying various voltage potentials to the corresponding components of the memory device.

Programming of the left bit A and the right bit B of the dual bit memory cell 102 can be performed using suitable programming mechanisms including hot electron injection. It is noted that an erased state corresponds to an amount of charge being stored by the charge storing at the left bit A and/or the right bit B that, during a read operation, would place a threshold voltage (VT) of the memory cell 102 equal to or less than an erase threshold voltage and within an erase state threshold voltage distribution. The programmed state corresponds to an amount of charge being stored by the charge storing at the left bit A and/or the right bit B that, during the read operation, would place the threshold voltage of the memory cell 102 for the respective bits (i.e., left and right sides of the memory cell 102) within a threshold voltage distribution that is higher than the erase threshold voltage and within a programmed state threshold distribution. It is appreciated that alternate aspects of the present invention can include multiple levels of programmed threshold voltages by using multi-level cell programming. By so doing, more than two bits can be stored in a dual bit memory cell.

One suitable programming mechanism that can be employed to program the dual bit memory cell 102 utilizes hot electron injection and is also referred to as channel hot electron injection (CHE). However, it should be appreciated that modifications to the programming techniques can be made to accommodate variations in the specific memory device used. Using hot electron injection, the first bit A can be programmed by applying a gate program voltage to the gate 109 and a drain program voltage to the second active region 106, which is an acting drain for the first bit A. The first active region 105, which is an acting source for programming the first bit A, can be connected to ground left to float, or biased to a voltage level.

The applied voltages generate a vertical electric field through the dielectric layers 108 and 107 and also through the charge trapping layer 103 and generate a lateral electric field across a length of the channel from the first active region 105 to the second active region 106. At a given threshold voltage, the channel inverts such that electrons are drawn off the acting source (the first active region 105 in this example) and begin accelerating towards the acting drain (the second active region 106 in this example). As the electrons move along the length of the channel, the electrons gain energy and, upon attaining enough energy, the electrons jump over the potential barrier of the bottom dielectric layer 108 and into the charge trapping layer 103, where the electrons become trapped.

The probability of electrons jumping the potential barrier is a maximum in the area of the first bit A, adjacent the first active region 105, where the electrons have gained the most energy. These accelerated electrons are termed hot electrons and, once injected into the charge trapping layer 103, stay in about the general area indicated for the first bit A. The trapped electrons tend not to spread laterally substantially through the charge trapping layer 103 due to this layer's low conductivity and low lateral electric field therein. Thus, the trapped charge remains generally localized in the charge trapping layer 103.

Programming for the second bit B is similar, but the first active region 105 operates as an acting drain and the second active region 106 operates as an acting source. Actual applied voltages for programming can vary by implementation. However, one example of suitable values for a programming operation for a bit of the dual bit memory cell 102 is a gate voltage of about 8 to 12 volts, an acting source voltage of about 0 volts, and an acting drain voltage of about 4–6 volts. A typical exemplary duration for applying the voltages is about 1 microsecond. After programming, a verify operation is typically performed that measures a threshold voltage corresponding to the programmed bit. If the verify operation fails, the programming operation can be performed again.

For a read operation, a certain voltage bias is applied across an acting drain to an acting source of the cell 102. The acting drain of the cell is a bitline, which may be connected to the drains of other cells in a byte or word group. A voltage is then applied to the gate 109 (e.g., the wordline) of the memory cell 102 in order to cause a current to flow from the acting drain to the acting source. The read operation gate voltage is typically applied at a level between a programmed threshold voltage (VT) and an un-programmed or erased threshold voltage. The resulting current is measured, by which a determination is made as to the data value stored in the cell. A second bit can be read by reversing operations of the first and second active regions 105 and 106 for the acting drain and the acting source.

Erasing of the dual bit memory cell 102 can be accomplished by employing hot hole injection or Fowler-Nordheim tunneling. However, it is appreciated that other appropriate erase operations may be employed. One suitable erasing mechanism is a blanket erase operation that applies a negative erase voltage (e.g., about –5 volts to about –10 volts) to the gate 109 and applies a positive bias voltage (e.g., about +4 volts to about +8 volts) to both the first and second active regions 105 and 106.

After the erasing operation is performed, an over-erase correction process or action is performed on the dual bit memory cell 102 that can adjust a threshold value for the memory cell thereby mitigating over-erase issues. The over-erase correction process can, if the memory cell 102 is over-erased, return the memory cell 102 to a normal erased state. The over-erase correction process applies a negative gate voltage to the gate 109 of the memory cell 102 for a specified period of time. The first active region 105, the second active region, and the substrate 104 are connected to ground. An example of the negative gate voltage is a value in the range-of about –10 volts to about –1.5 volts and a suitable period of time or duration is about 0.1 microseconds to about 1 second. If the dual bit memory cell 102 is over-erased, there will be a relatively large presence of holes in the charge trapping layer 103. During the correction process, no band to band current is present, which prevents additional holes from flowing into the charge trapping layer 103. If a large number of holes are present in the charge trapping layer 103, the correction process compensates for the presence of these holes by pulling electrons to those holes thereby increasing the threshold voltage of the memory cell 102. If a large number of holes are not present in the charge trapping layer 103, electrons are not pulled toward the charge trapping layer 103 due to the absence of the holes and the threshold voltage of the memory cell 102 is not substantially adjusted.

Figure 2:
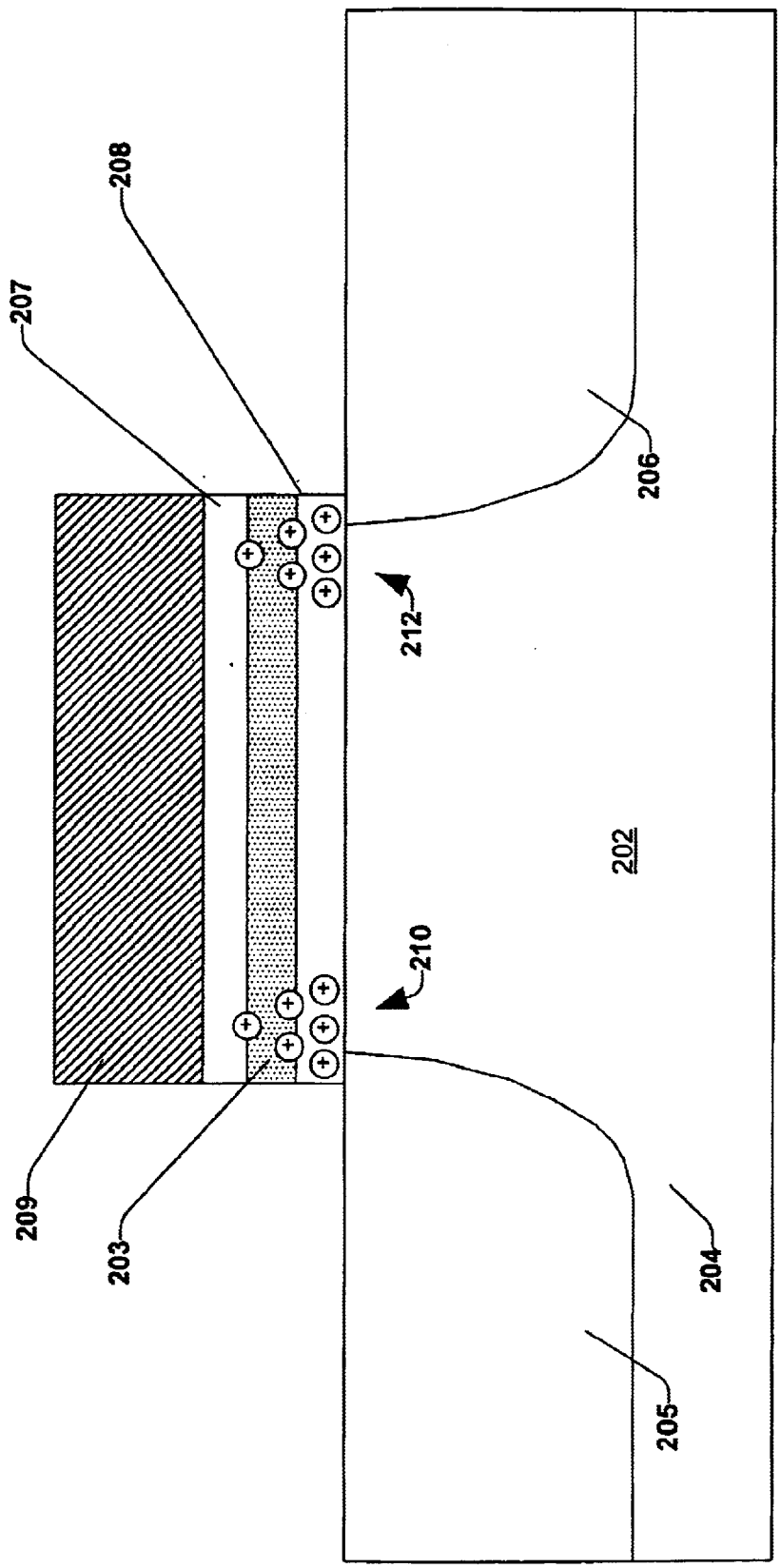
FIG. 2 is a cross sectional view illustrating an over-erased dual bit memory cell in accordance with an aspect of the present invention

FIG. 2 is a cross sectional view illustrating an over-erased dual bit memory cell 202 in accordance with an aspect of the present invention. The memory cell 202 comprises a charge trapping layer 203 that may comprise silicon nitride or any other type of charge trapping layer and is sandwiched between two insulating layers 207 and 208 comprised of a suitable dielectric material such as silicon dioxide. Overlying insulating layer 207 is a polysilicon gate 209 A P-type substrate 204 has buried active regions including a first active region 205 and a second active region 206. The active regions 205 and 206 are n-type in this example.

This memory cell 202 is over-erased and, as a result, has a relatively large amount of holes present at or near the charge trapping layer 203 for both bits. A first amount of holes 210 are present near a first bit location and a second amount of holes 212 are present near a second bit location. The presence of the first holes 210 and the second holes 212 causes a threshold voltage for each bit of this memory cell 202 to be lower than a threshold amount. As will be appreciated, the present invention is also applicable to over-erase conditions where one or both of the bits of the memory cell are over-erased.

Figure 3:
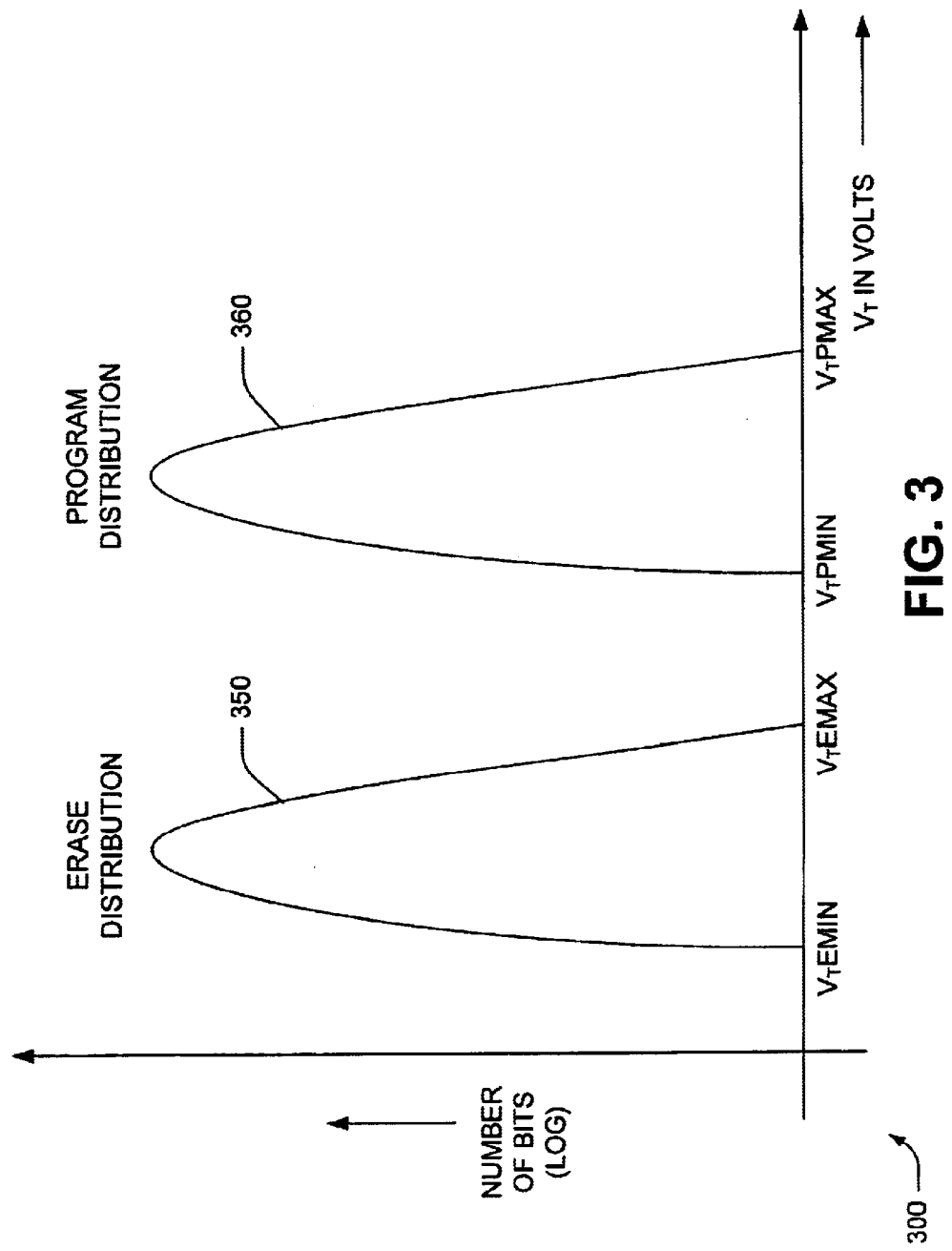
FIG. 3 is a graph illustrating an erase and program distribution for an array of dual bit memory cells that are not over-erased.

FIG. 3 is a graph 300 illustrating an erase and program distribution for an array of dual bit memory cells that are not over-erased. The graph 300 depicts voltage along an x-axis and number of bits (log) along a y-axis. An erase distribution 350 depicts or simulates bits of the array of dual bit memory cells and corresponding threshold voltage values after a successful erase operation. The bits fall within a minimum threshold value $V_T$EMIN and a maximum threshold value $V_T$EMAX for the erase distribution 350. A program distribution 360 simulates the bits of the array and corresponding threshold voltage values after a successful program operation. The bits fall within a minimum program threshold value $V_T$PMIN and a maximum program threshold value $V_T$PMAX for the program distribution 360. It is appreciated that threshold voltages for the programmed bits are higher than the threshold voltages for the erased bits.

Figure 4:
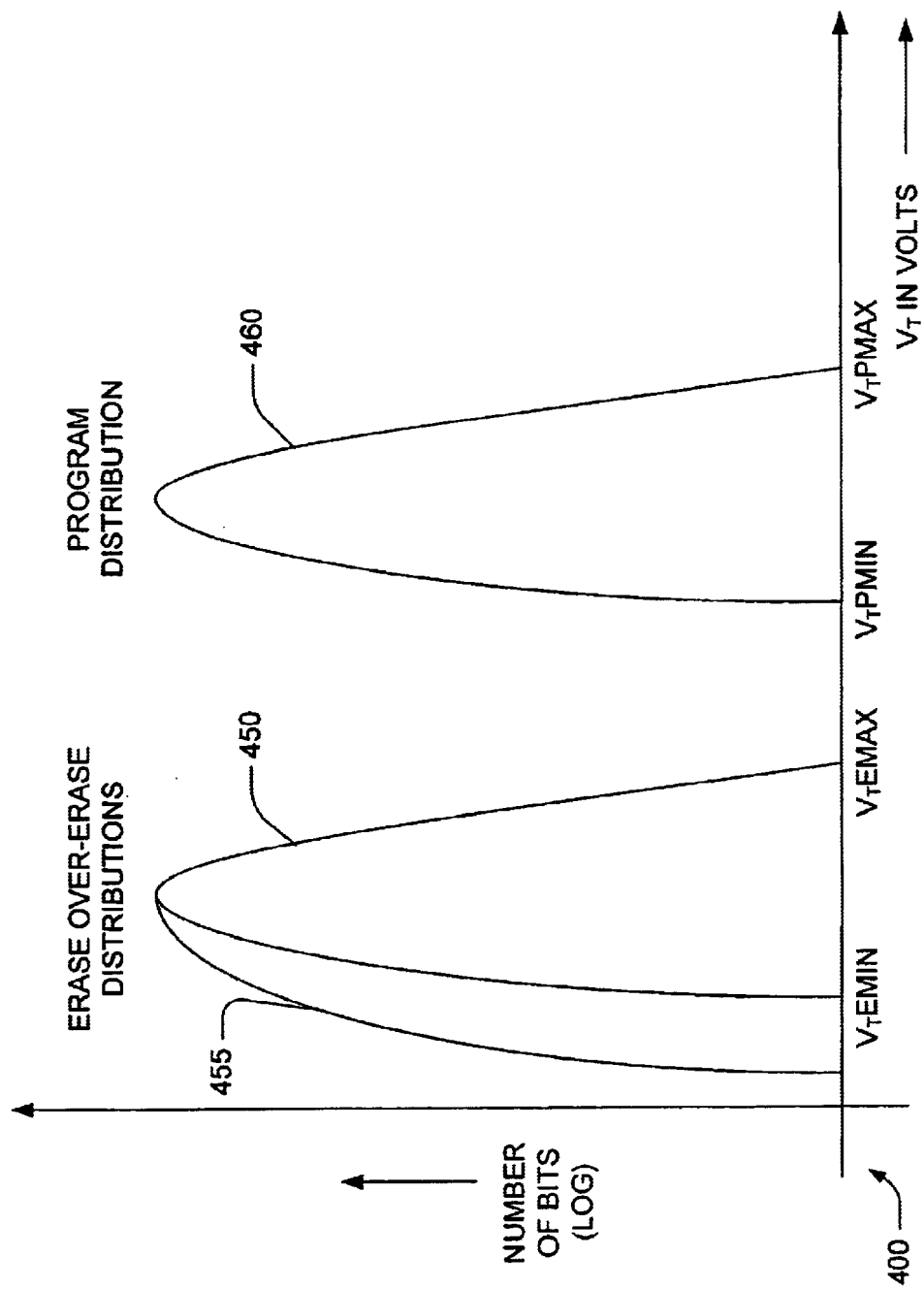
FIG. 4 is another graph illustrating an erase and program distribution for an array of dual bit memory cells that are over-erased.

FIG. 4 is another graph 400 illustrating an erase and program distribution for an array of dual bit memory cells that have some percentage of cells that are over-erased. The graph 400 depicts voltage along an x-axis and number of bits (log) along a y-axis. An erase distribution 450 depicts or simulates bits of the array of dual bit memory cells and corresponding threshold voltage values after a successful erase operation. Some of the erased bits fall within a minimum threshold value $V_T$EMIN and a maximum threshold value $V_T$EMAX for the erase distribution 450. However, other erased bits are over-erased and fall with a distribution 455 of bits that have threshold values below the minimum erase threshold value $V_T$EMIN. A program distribution 460 simulates the bits of the array and corresponding threshold voltage values after a successful program operation. The bits fall within a minimum program threshold value $V_T$PMIN and a maximum program threshold value $V_T$PMAX for the program distribution 460. It is appreciated that threshold voltages for the programmed bits are higher than the threshold voltages for the erased bits.

The corrective process of the present invention causes the over-erased bits of the distribution 455 to have threshold voltages greater than or equal to the minimum erase threshold value $V_T$EMIN. As a result, the over-erased bits of the distribution 455 are moved into the normal erased distribution 450 because of the present invention.

Figure 5:
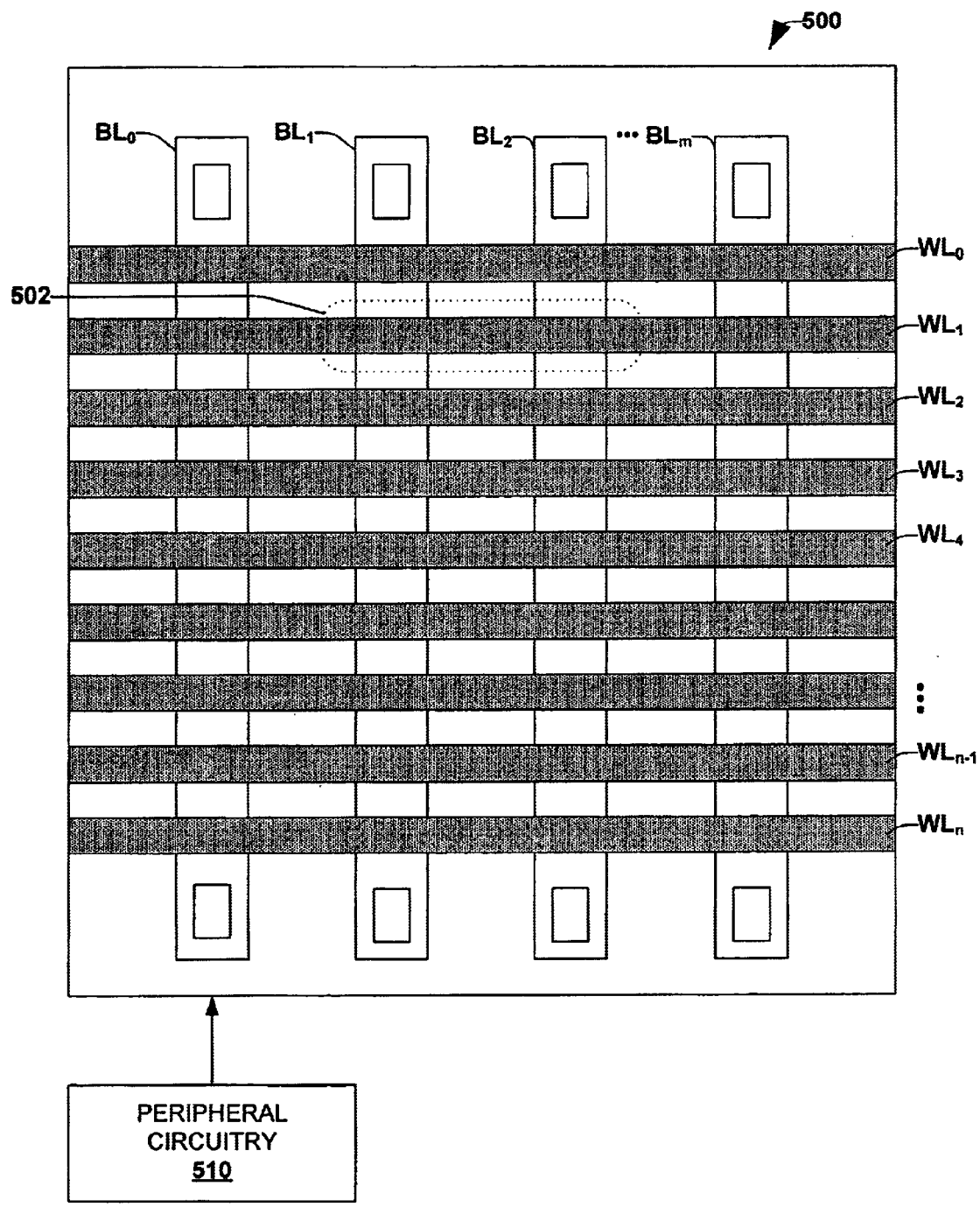
FIG. 5 is a schematic diagram illustrating a layout of a memory array in accordance with an aspect of the present invention.

FIG. 5 is a schematic diagram illustrating a layout of a memory array 500 in accordance with an aspect of the present invention. This layout is provided for illustrative purposes and it is appreciated that other layouts as well as variations of the layout present are included and contemplated by the present invention. Dual bit memory cells are organized into the array of rows and columns, wherein each row is a wordline ($WL_0, W_1, \ldots WL_n$) coupled to or forming the gate of each memory cell and the columns are bitlines ($B_0, BL_1, \ldots BL_m$) coupled to or forming the source and drain of each memory cell. Voltage potentials are applied to corresponding components of each memory device, such as the bitlines ($BL_0, BL_1, \ldots BL_m$) and wordlines ($WL_0, WL_1, \ldots WL_m$), using peripheral circuitry 510, including, but not limited to, power sources, bitline drivers and/or controllers, and wordline drivers and/or controllers.

A dual bit memory cell 502 can be configured as virtual ground device. That is, during various operations of the memory device 502, either of its active regions can function as a source of electrons and the other can be grounded or connected to a bias potential. In addition, the dual bit memory cell 502 can be connected in series with at least one adjacent memory device such that a first active region of the cell 502 can be formed from a conductive region, which also forms a second active region of an adjacent memory cell.

The conductive region can be implemented as a buried bitline. Accordingly, the second active region of the adjacent memory device is also coupled to the second bitline $BL_2$. A first active region of the adjacent memory device can be coupled to or formed from a third bitline $BL_3$. A gate of the adjacent memory device can also be coupled to or formed from the first wordline $WL_1$. Similarly, the second active region of the cell 502 can be formed from a conductive region that also forms the first active region of another adjacent memory device disposed adjacent the second active region of the memory cell 502. It is noted that the active regions of adjacent memory devices need not be formed from a single conductive region, but can be formed from separate structures that are electrically connected together (e.g., a pair of conductive regions spaced apart by a trench isolation region and connected by a conductive layer, such as a silicide).

Figure 6:
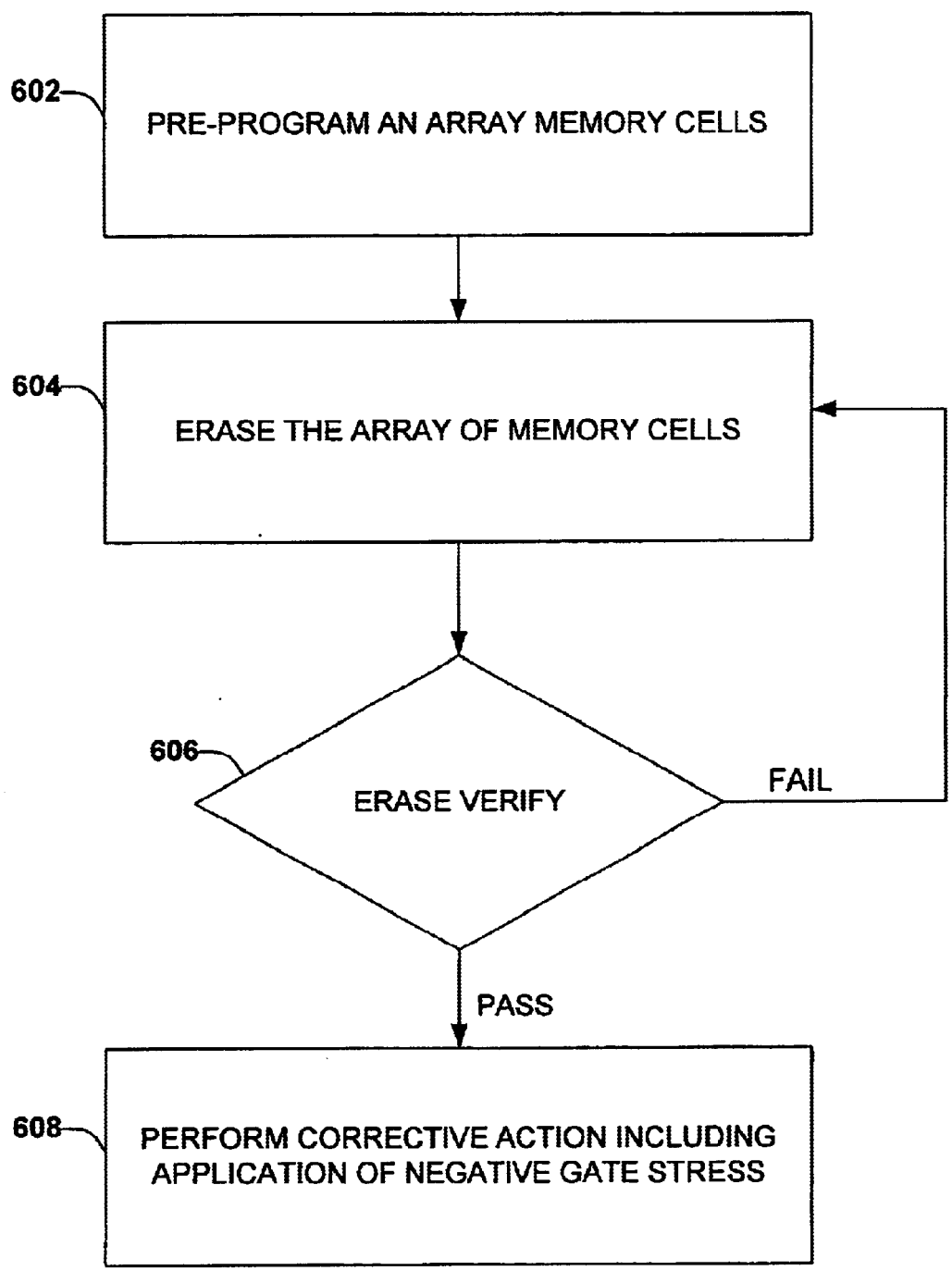
FIG. 6 is a flow diagram illustrating a method of erasing an array of dual bit memory cells that includes applying a negative gate voltage to correct over-erased memory cells in accordance with an aspect of the present invention.
Figure 7:
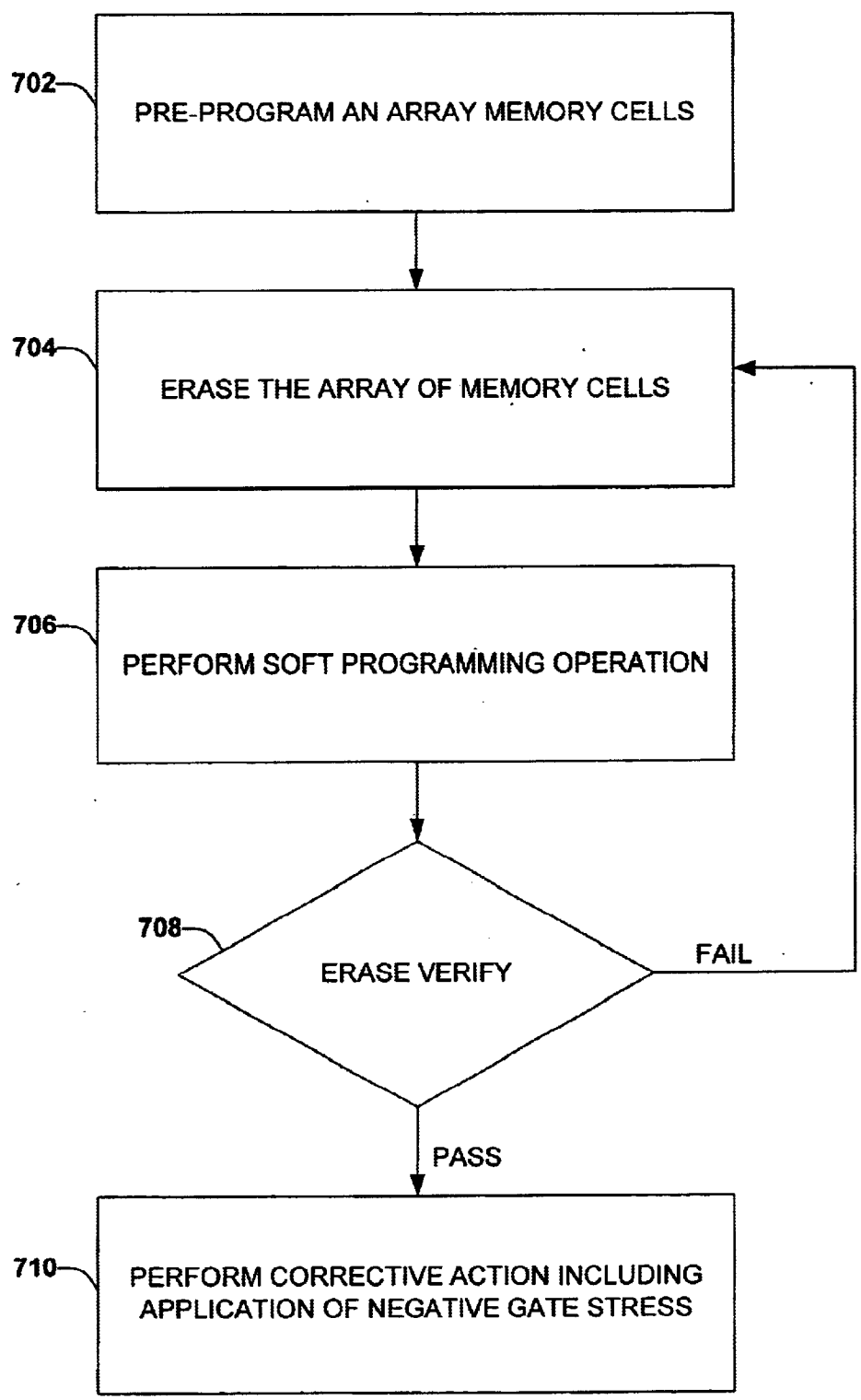
FIG. 7 is a flow diagram illustrating a method of erasing an array of dual bit memory cells that includes applying a negative gate voltage and soft programming to correct over-erased memory cells in accordance with an aspect of the present invention.

In view of the foregoing structural and functional features described supra, methodologies in accordance with various aspects of the present invention will be better appreciated with reference to FIGS. 1 to 5. While, for purposes of simplicity of explanation, the methodologies of FIGS. 6 and 7 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 6 is a flow diagram illustrating a method of erasing an array of dual bit memory cells that includes applying a negative gate voltage to correct over-erased memory cells in accordance with an aspect of the present invention. The method erases the array in a block operation and performs a corrective action that converts over-erased memory cells into non-over-erased memory cells.

The method begins at block 602, wherein first and/or second bits of each memory cell in the array are programmed to approximately the same charge level. This programming is referred to as pre-programming and can include injecting charge into the cells via channel hot electron injection or another suitable technique. More specifically, sufficient charge can be injected or otherwise programmed into the array of memory cells so as to pre-program the array of memory cells to a substantially uniform programmed state (e.g., programmed with 0). The purpose of preprogramming is to bring the memory cells in the array to the same level (i.e., to have about the same threshold voltage) in an effort to avoid having some memory cells, which were either not programmed or may have lost charge during normal operations, from being substantially over-erased. It is appreciated that variations of this method in accordance with the present invention can omit the pre-programming operation.

Subsequently, the memory cells of the array are erased by application of one or more erase pulses 604. A suitable erase mechanism is to employ hot hole injection in order to reduce threshold voltages of the memory cells. As an example, the array of memory cells can be erased in a block operation that applies a negative erase voltage (e.g., about −5 volts to about −10 volts) to gates and applies a positive bias voltage (e.g., about +4 volts to about +8 volts) to both the first and second active regions of the dual bit memory cells of the array.

An erase verification operation is performed at block 606 that identifies memory cells of the array that have been under-erased. As described supra, threshold voltages for first and second bits of the memory cells are measured and compared with an erase threshold value. If the measured threshold voltages are below the threshold value, the bit of that cell is deemed erased, otherwise the bit for that memory cell is deemed under-erased. If one or more under-erased memory cells are identified, the method returns to block 604 wherein another erase operation is performed.

It is appreciated that after the erase operation at block 604 and the verify operation at block 606, some memory cells of the array can be over-erased. Generally, these over-erased cells have excess positive charge or holes trapped within their respective charge storing/trapping layers as illustrated FIG. 2. These over-erased memory cells have a threshold voltage below an acceptable minimum value as illustrated by the population 455 of FIG. 4 and their threshold voltage can fall below zero and become negative.

Continuing at block 608, an over-erase corrective action is performed that includes applying a negative gate stress to the array of memory cells. The over-erase corrective action is a block operation performed on all the cells in the array at the same. Additionally, the over-erase corrective action is not harmful to non-over-erased cells and can be performed without testing for over-erased cells without incurring a substantial harm. Generally, a negative gate voltage is applied to the gates of the memory cells of the array while first and second active regions are connected to ground or left to float for a suitable duration of time (e.g., about 1 millisecond to 5 millisecond in one example). However, it is appreciated that other suitable durations of time for applying the negative gate voltage can be employed in accordance with the present invention. An example of a range of suitable negative gate voltages that can be employed is about $-10$ volts to about 1.5 volts. It is appreciated that a more negative voltage requires less of a duration in order to correct over-erased memory cells. It is also appreciated that the over-erase corrective action performed at block 608 can include operations in addition to application of the negative gate voltage to the array of memory cells, such as a soft programming operation.

FIG. 7 is a flow diagram illustrating a method of erasing an array of dual bit memory cells that includes applying a negative gate voltage and soft programming to correct over-erased memory cells in accordance with an aspect of the present invention.

The method erases the array in a block operation and performs a corrective action that can convert over-erased memory cells into non-over-erased memory cells.

The method begins at block 702, wherein first and/or second bits of each memory cell in the array are programmed to approximately the same charge level. This programming is referred to as pre-programming and can include injecting charge into the cells via channel hot electron injection or another suitable technique. Sufficient charge can be injected or programmed into the array of memory cells so as to preprogram the array of memory cells to a substantially uniform programmed state (e.g., programmed with 0). It is appreciated that variations of this method in accordance with the present invention can omit the pre-programming operation.

Subsequently, the memory cells of the array are erased by application of one or more erase pulses at block 704. A suitable erase mechanism employs hot hole injection to reduce threshold voltages of the memory cells to below a threshold value. As an example, the array of memory cells can be erased in a block operation that applies a negative erase voltage (e.g., about $-5$ volts to about $-10$ volts) to gates and applies a positive bias voltage (e.g., about +4 volts to about +8 volts) to both the first and second active regions of the dual bit memory cells of the array;

A soft programming operation is performed on the array of dual bit memory cells at block 706. The soft programming operation can be performed on a cell-by-cell basis or on a column-by-column basis. Optionally, the soft programming operation can be accompanied by a soft programming verify operation to determine whether any memory cells have a threshold voltage below a predetermined minimum value, which may or may not be below zero volts.

An example of a suitable soft programming operation includes applying a voltage potential (e.g., about +4 volts to about +8 volts), to the gates of the memory cells and applying a voltage potential (e.g., about +3 volts to about +5 volts), to an acting drain, while grounding or floating the acting source. The soft programming operation is performed for a suitable duration, such as between about 0.5 microseconds and about 0.5 seconds. It is to be appreciated that these voltage potentials and durations may be varied to select at what point along channels of the memory cells charge is injected into the charge trapping layers. Additionally, the applied voltages can be modulated.

An erase verification operation is performed at block 708 that identifies memory cells of the array that have been under-erased. Generally, threshold voltages for first and second bits of the memory cells are measured and compared with an erase threshold value. If the measured threshold voltages are below the threshold value, the bit of that cell is deemed erased, otherwise the bit for that memory cell is deemed under-erased. If one or more under-erased memory cells are identified, the method returns to block 704 wherein another erase operation is performed.

It is appreciated that after the erase operation at block 704, the soft programming operation at block 706 and the verify operation at block 708, some memory cells of the array can be over-erased, as described supra. Continuing at block 710, an over-erase corrective action is performed that includes applying a negative gate stress to the array of memory cells. Generally, a negative gate voltage is applied to the gates of the memory cells of the array while first and second active regions are connected to ground or left to float for a suitable duration of time (e.g., about 1 millisecond to 5 millisecond in one example). However, it is appreciated that other suitable durations of time for applying the negative gate voltage can be employed in accordance with the present invention. An example of a range of suitable negative gate voltages that can be employed is about $-10$ volts to about $-1.5$ volts. It is appreciated that a more negative voltage requires less of a duration in order to correct over-erased memory cells. It is also appreciated that the over-erase corrective action performed at block 708 can include operations in addition to application of the negative gate voltage to the array of memory cells, such as a second soft programming operation.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of operating an array of dual bit memory cells comprising:

performing a block erase operation on the array of dual bit memory cells;

verifying the block erase operation of the array of dual bit memory cells to identify under-erased memory cells and re-performing the block operation on identifying under-erased memory cells; and performing an over-erase corrective action that includes applying a negative gate stress to the array of memory cells.

2. The method of claim 1, wherein verifying the block operation includes identifying under-erased memory cells by measuring threshold voltage values for first and second bits for respective memory cells of the array and comparing the measured values with a minimum erase threshold voltage value.

3. The method of claim 1, wherein the block erase operation reduces threshold voltage values corresponding to first and second bits of respective memory cells of the array.

4. The method of claim 1, wherein applying the negative gate stress comprises applying a negative erase voltage to gates of memory cells of the array and applying a positive bias voltage to first and second active regions of memory cells of the array.

5. The method of claim 4, wherein the applied negative erase voltage is selected from a range of about −10 volts to about −1.5 volts.

6. The method of claim 4, wherein the applied positive bias voltage is selected from a range of about 4 volts to about 6 volts.

7. The method of claim 5, wherein the negative gate stress is applied for a duration selected from a range comprising about 0.1 microseconds to about 1 second, and the duration is selected according to the applied negative erase voltage to correct over-erased memory cells.

8. The method of claim 1, wherein performing the block erase operation creates at least one over-erased memory cell of the array of memory cells.

9. The method of claim 1, wherein re-performing the block erase operation creates at least one over-erased memory cell of the array of memory cells.

10. The method of claim 8, wherein performing the over-erase corrective action corrects the at least one over-erased memory cell.

11. The method of claim 1, further comprising performing an over-erase verify operation that identifies over-erased memory cells prior to performing the over-erase corrective action.

12. The method of claim 1, further comprising performing an over-erase verify operation that identifies over-erased memory cells after performing the over-erase corrective action.

13. The method of claim 1, wherein performing the over-erase corrective action further comprises performing a soft program operation on the array of dual bit memory cells.

14. The method of claim 13, wherein performing the over-erase corrective action further comprises performing a soft program verify operation on the array of dual bit memory cells after performing the soft program operation.

15. The method of claim 1, further comprising pre-programming the array of dual bit memory cells prior to performing the block erase operation.

16. A method of erasing an array of dual bit memory cells comprising:

performing a block erase operation on the array of dual bit memory cells;

performing a soft program operation on the array of dual bit memory cells to slightly raise threshold voltage values for first and second bits of memory cells of the array;

verifying the block erase operation of the array of dual bit memory cells to identify under-erased memory cells by measuring threshold voltage values for the first and second bits of the memory cells and re-performing the block operation on identifying under-erased memory cells; and performing an over-erase corrective action that includes applying a negative gate stress to the array of memory cells.

17. The method of claim 16, wherein performing an over-erase corrective action further includes performing a second soft program operation.

18. The method of claim 16, wherein performing the soft program operation comprises applying a soft program gate voltage to gates of the memory cells, applying a soft program drain voltage to acting drains of the memory cells, and applying a soft program source voltage to acting sources of the memory cells.

19. The method of claim 18, wherein the applied soft program gate voltage is selected from a range comprising about 4 volts to about 8 volts, the soft program drain voltage is selected from a range comprising about 3 volts to about 5 volts, and the soft program source voltage is selected from a range comprising floating and ground.

20. The method of claim 16, wherein the soft program operation is performed for a duration selected from a range comprising about 0.5 microseconds to about 0.5 seconds.

21. A method of applying a negative gate stress to a dual bit-memory cell comprising:

selecting a negative gate voltage and a duration that corrects an over-erased dual bit memory cell;

applying a negative gate voltage to a gate of the dual bit memory cell for the selected duration; and while applying the negative gate voltage, connecting a first active region, a second active region, and a substrate of the dual bit memory cell to ground.

22. The method of claim 21, wherein the dual bit memory cell has a threshold voltage for at least one of its bits that is below a minimum erase threshold value prior to applying the negative gate voltage.

23. The method of claim 21, wherein the dual bit memory cell has a threshold voltage within an acceptable range of erase threshold voltage values prior to applying the negative gate voltage and after applying the negative gate voltage.

* * * * *